United States Patent
Chen et al.

(10) Patent No.: US 9,786,779 B2
(45) Date of Patent: Oct. 10, 2017

(54) HIGH VOLTAGE DOUBLE-DIFFUSED MOS (DMOS) DEVICE AND METHOD OF MANUFACTURE

(71) Applicant: Microchip Technology Incorporated, Chandler, AZ (US)

(72) Inventors: Bomy Chen, Newark, CA (US); Sonu Daryanani, Tempe, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/964,017

(22) Filed: Dec. 9, 2015

(65) Prior Publication Data

US 2016/0099348 A1    Apr. 7, 2016

Related U.S. Application Data

(62) Division of application No. 14/157,337, filed on Jan. 16, 2014, now Pat. No. 9,306,055.

(51) Int. Cl.
*H01L 29/78* (2006.01)
*H01L 29/66* (2006.01)
(Continued)

(52) U.S. Cl.
CPC ...... *H01L 29/7816* (2013.01); *G11C 16/0408* (2013.01); *G11C 16/06* (2013.01);
(Continued)

(58) Field of Classification Search
None
See application file for complete search history.

(56) References Cited

U.S. PATENT DOCUMENTS

| 5,790,455 A | 8/1998 | Caywood ............... 365/185.06 |
| 5,844,275 A | 12/1998 | Kitamura et al. ............ 257/335 |

(Continued)

FOREIGN PATENT DOCUMENTS

| EP | 2267775 A2 | 12/2010 | ............ G11C 16/04 |
| EP | 2339585 A1 | 6/2011 | ............ G11C 16/00 |

OTHER PUBLICATIONS

U.S. Non-Final Office Action, U.S. Appl. No. 14/964,548, 11 pages, Sep. 1, 2016.

(Continued)

*Primary Examiner* — Andres Munoz
(74) *Attorney, Agent, or Firm* — Slayden Grubert Beard PLLC

(57) ABSTRACT

A method of forming an integrated DMOS transistor/EEPROM cell includes forming a first mask over a substrate, forming a drift implant in the substrate using the first mask to align the drift implant, simultaneously forming a first floating gate over the drift implant, and a second floating gate spaced apart from the drift implant, forming a second mask covering the second floating gate and covering a portion of the first floating gate, forming a base implant in the substrate using an edge of the first floating gate to self-align the base implant region, and simultaneously forming a first control gate over the first floating gate and a second control gate over the second floating gate. The first floating gate, first control gate, drift implant, and base implant form components of the DMOS transistor, and the second floating gate and second control gate form components of the EEPROM cell.

22 Claims, 8 Drawing Sheets

(51) Int. Cl.

| | | |
|---|---|---|
| H01L 23/552 | (2006.01) | |
| H01L 29/08 | (2006.01) | |
| H01L 29/10 | (2006.01) | |
| H01L 27/11543 | (2017.01) | |
| H01L 29/06 | (2006.01) | |
| H01L 29/40 | (2006.01) | |
| H01L 27/11524 | (2017.01) | |
| H01L 21/265 | (2006.01) | |
| H01L 21/266 | (2006.01) | |
| H01L 29/788 | (2006.01) | |
| G11C 16/04 | (2006.01) | |
| G11C 16/06 | (2006.01) | |

(52) U.S. Cl.
CPC ........ *H01L 21/266* (2013.01); *H01L 21/2652* (2013.01); *H01L 23/552* (2013.01); *H01L 27/11524* (2013.01); *H01L 27/11543* (2013.01); *H01L 29/0653* (2013.01); *H01L 29/0856* (2013.01); *H01L 29/1095* (2013.01); *H01L 29/402* (2013.01); *H01L 29/66674* (2013.01); *H01L 29/66681* (2013.01); *H01L 29/66825* (2013.01); *H01L 29/7801* (2013.01); *H01L 29/7883* (2013.01); *H01L 29/086* (2013.01); *H01L 29/0878* (2013.01); *H01L 2924/0002* (2013.01)

(56) References Cited

U.S. PATENT DOCUMENTS

| | | | |
|---|---|---|---|
| 5,912,490 A | 6/1999 | Hebert et al. | 257/340 |
| 5,986,931 A | 11/1999 | Caywood | 365/185.06 |
| 6,548,874 B1 | 4/2003 | Morton et al. | 257/371 |
| 6,825,531 B1 | 11/2004 | Mallikarjunaswamy | 257/343 |
| 7,348,256 B2 | 3/2008 | Miller, Jr. et al. | 438/435 |
| 7,462,906 B2 | 12/2008 | Lu et al. | 257/316 |
| 7,964,915 B2 | 6/2011 | Tanaka et al. | 257/341 |
| 8,823,096 B2 | 9/2014 | Su et al. | 257/340 |
| 9,064,868 B2 | 6/2015 | Liu et al. | |
| 9,362,398 B2 | 6/2016 | Pendharkar | |
| 2002/0072159 A1 | 6/2002 | Nishibe et al. | 438/179 |
| 2005/0236666 A1 | 10/2005 | Wang | 257/339 |
| 2006/0261408 A1 | 11/2006 | Khemka et al. | 257/335 |
| 2008/0191291 A1 | 8/2008 | Wu et al. | 257/409 |
| 2008/0246080 A1 | 10/2008 | Ito et al. | 257/328 |
| 2009/0166736 A1 | 7/2009 | Park | 257/343 |
| 2010/0006937 A1 | 1/2010 | Lee | 257/343 |
| 2010/0096697 A1 | 4/2010 | Su et al. | 257/343 |
| 2011/0057271 A1 | 3/2011 | Ito et al. | 257/408 |
| 2011/0241112 A1 | 10/2011 | Zuniga | 257/343 |
| 2013/0037887 A1 | 2/2013 | Takata et al. | 257/369 |
| 2013/0134512 A1 | 5/2013 | Cheng et al. | 257/339 |

OTHER PUBLICATIONS

International Search Report and Written Opinion, Application No. PCT/US2015/011299, 16 pages, Jun. 30, 2015.
European Office Action, Application No. 15706074.0, 5 pages, May 22, 2017.

HIGH VOLTAGE DOUBLE-DIFFUSED MOS (DMOS) DEVICE AND METHOD OF MANUFACTURE

RELATED PATENT APPLICATIONS

This application is a Divisional of U.S. patent application Ser. No. 14/157,337 filed on Jan. 16, 2014, all of which are hereby incorporated by reference herein for all purposes.

TECHNICAL FIELD

The present disclosure relates to a high-voltage double-diffused MOS device (HV DMOS) and a method of manufacture. The present disclosure also relates to a process flow for creating an integrated EEPROM cell and HV DMOS for use in high voltage applications, e.g., motor control, lighting, switches, etc.

BACKGROUND

EEPROM is a class of nonvolatile semiconductor memory in which information may be electronically programmed into and erased from each memory element or bit cell. Each bit cell of the EEPROM comprises two metal oxide semiconductor field effect transistors (MOSFET). One of the MOSFETs has two gates and is used to store the bit information, and the other MOSFET is used in the selection of the bit cell. EEPROMs are typically realized as arrays of floating gate transistors.

An typical EEPROM bit cell includes a floating gate arranged between source and drain regions formed in a silicon substrate, and a control gate that controls the charging of the floating gate, which is arranged (isolated) to hold a charge. With no charge on the floating gate, the transistor acts normally, and a pulse on the control gate causes current to flow. When charged, it blocks the control gate action, and current does not flow. Charging is accomplished by grounding the source and drain terminals and placing sufficient voltage on a control gate tunnel through an oxide to the floating gate. A reverse voltage channeled from another transistor clears the charge by causing it to dissipate into the substrate.

Some EEPROM designs provide N-channel cells over a P-well substrate. Other designs provide P-channel cells over an N-well, which itself resides in a P-type substrate, such as disclosed in U.S. Pat. Nos. 5,986,931 and 5,790,455, EP2339585A1, and EP2267775A2, which are herein incorporated by reference in their entirety.

A double diffused metal oxide semiconductor (DMOS) is a common transistor suitable for high voltage applications. A DMOS is referred to as "double diffused" because the diffusion process involves creating both N and P doped areas. DMOS transistors typically provide a higher breakdown voltage and lower on-state resistance as compared with many other transistor types. Some DMOS structures define a lateral channel between the source and drain regions, in which the channel is located below the gate (e.g., floating gate). Performance characteristics of such DMOS cells, such as breakdown voltage and on-state resistance, are typically determined by parameters include the channel dimensions and doping characteristics.

SUMMARY

According to one embodiment, a double diffused metal oxide semiconductor (DMOS) device may include a substrate, a base implant region formed in the substrate, a source region formed in the base implant, a drain region formed in the substrate, a floating gate formed above the substrate, a control gate extending over the base implant region, a floating gate electrode electrically coupled to the floating gate, and control electronics configured to control a voltage applied to the floating gate via the floating gate electrode, thereby controlling a breakdown voltage and a source-drain resistance of the DMOS device.

According to another embodiment, a method of simultaneously forming a DMOS transistor and an EEPROM cell may include forming a first mask over a substrate, forming a drift implant region in the substrate using the first mask to align the drift implant region, simultaneously forming a first floating gate over the drift implant region in the substrate, and a second floating gate over the substrate at a location spaced apart from the drift implant region, forming a second mask covering the second floating gate and covering a portion of the first floating gate, forming a base implant region in the substrate using an edge of the first floating gate to self-align the base implant region, and simultaneously forming a first control gate over the first floating gate and a second control gate over the second floating gate, wherein the first floating gate, first control gate, drift implant region, and base implant region form components of the DMOS transistor, and wherein the second floating gate and second control gate form components of the EEPROM cell.

According to another embodiment, a method is provided for controlling a DMOS transistor including a base implant region formed in a substrate, a source region formed in the base implant, a drain region formed in the substrate, a floating gate, a control gate extending over the base implant region, a control gate electrode electrically coupled to the control gate, and a floating gate electrode electrically coupled to the floating gate. The method includes applying a voltage to the floating gate via the floating gate electrode, thereby influencing a breakdown voltage and a source-drain resistance of the DMOS device.

BRIEF DESCRIPTION OF THE FIGURES

Example embodiments are discussed below with reference to the drawings, in which.

DETAILED DESCRIPTION

FIGS. 1 through 8 illustrate an example process for forming a device including an integrated high voltage HV DMOS transistor/EEPROM cell. In the illustrated example, the HV DMOS transistor and EEPROM cell are formed as n-type devices. However, the HV DMOS transistor and EEPROM cell may alternatively be formed as p-type devices according to the process disclosed below, by switching the dopants throughout the process.

In some embodiments, the illustrated integrated n-type HV DMOS transistor and n-type EEPROM cell are formed as part of a larger array of semiconductor devices that includes both (a) multiple integrated n-type HV DMOS transistors and n-type EEPROM cells and (b) multiple integrated p-type HV DMOS transistors and p-type EEPROM cells. Thus, to fabricate such an array, the process steps discussed below for producing n-type HV DMOS transistors and n-type EEPROM cells may be repeated with the n-type/p-type doping switched in order to produce the p-type HV DMOS transistors and p-type EEPROM cells of the array, such that the array may be fabricated by a single process flow.

Figure 1:
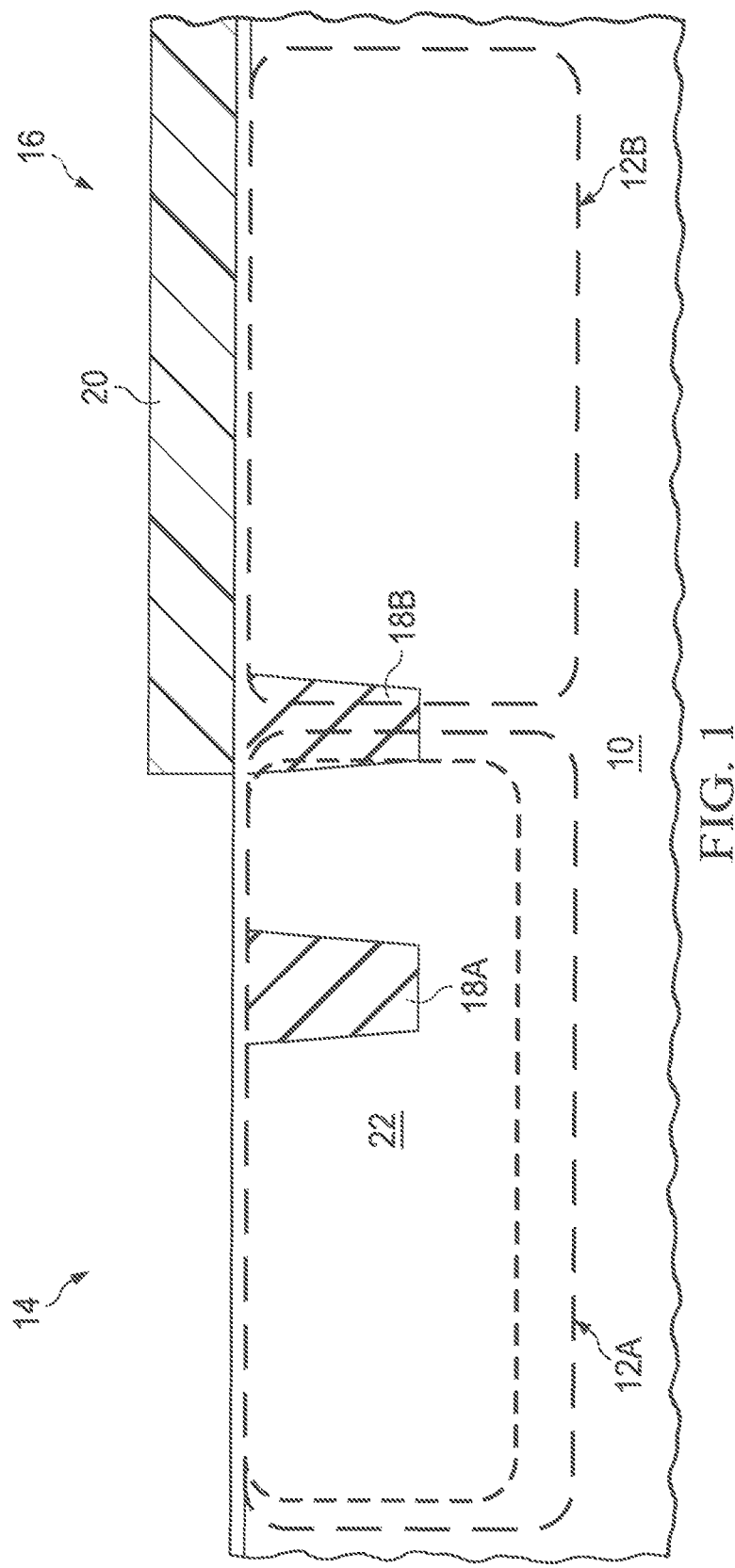
FIGS. 1 through 8 illustrate an example process for forming a device including an integrated high voltage (HV) DMOS transistor/EEPROM cell, according to one embodiment.

As shown in FIG. 1, the device may be formed in a semiconductor substrate 10 for from any suitable material, e.g., silicon, GaAs, InP, etc. First, high voltage (HV) p-wells 12A and 12B are formed in the substrate 10, using any suitable techniques. HV p-well 12A is provided for the DMOS transistor, while p-well 12B is provided for the EEPROM cell, as discussed below. For reference, the area of the DMOS transistor being formed is indicated at 14, and the area of the EEPROM cell being formed is indicated at 16. As shown, HV p-wells 12A and 12B may be spaced apart from each other by a region of the substrate 10.

A pair of isolation regions 18A and 18B are then formed in the substrate using any suitable technique. For example, isolation regions 18A and 18B may be formed as shallow trench isolation (STI) regions of oxide or any other suitable isolation material. As will be shown below, isolation region 18A is formed at a location between subsequently-formed base implant and drain regions of the HV DMOS transistor, and isolation region 18B is formed between the subsequently-formed drain region of the DMOS transistor and a subsequently-formed source region of the EEPROM cell. A photomask 20 may then be formed over the EEPROM cell region and an n-drift implant region 22 is formed in the HV p-well 14A, aligned by the photomask 20. The photomask 20 may then be removed.

In some embodiments, the steps discussed above regarding FIG. 1 may also be repeated, with the n-type/p-type doping switched, for producing p-type HV DMOS transistors EEPROM cells of an integrated array, as discussed above. Thus, another photomask (not shown) corresponding to photomask 20 may be used for locating p-drift implant regions for p-type DMOS transistors being formed in the array.

Figure 2:
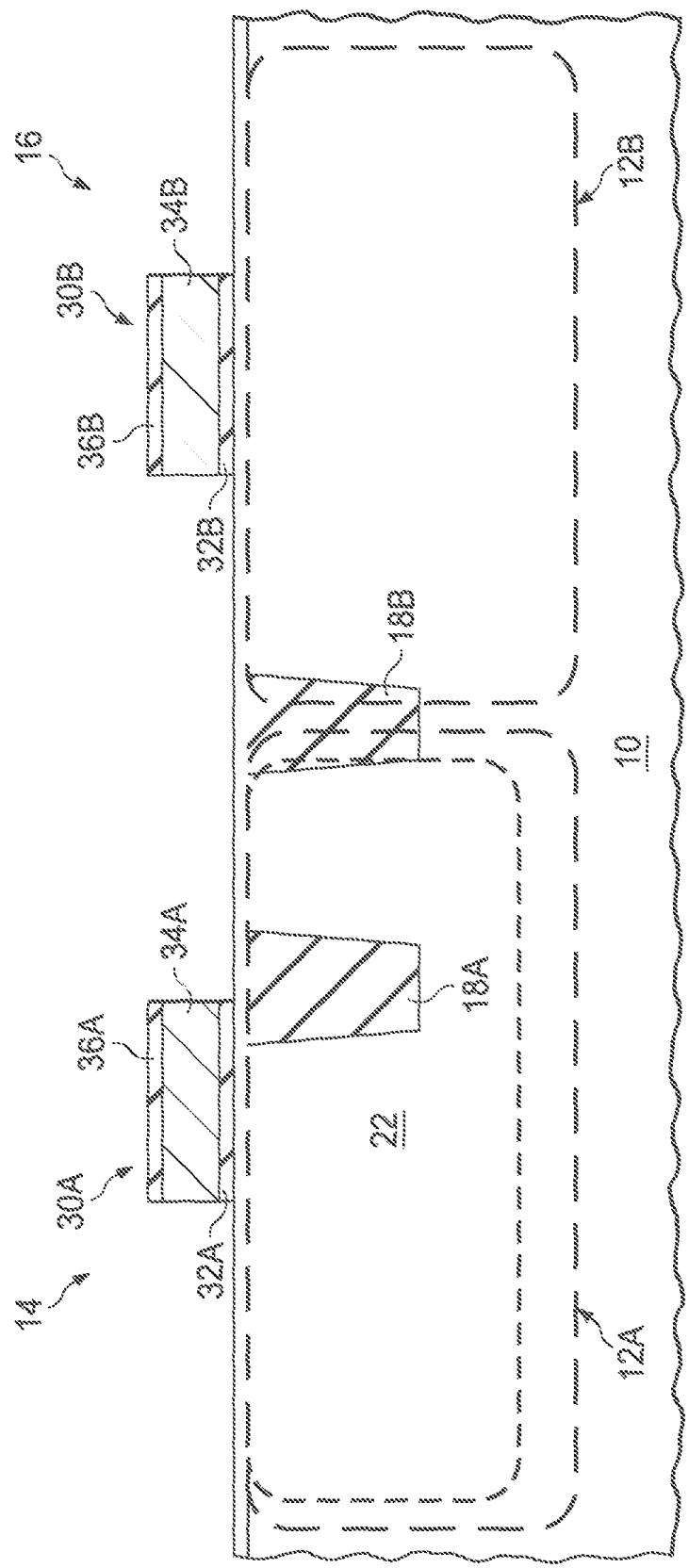

Next, as shown in FIG. 2, an HV DMOS floating gate structure 30A and an EEPROM floating gate structure 30B may be simultaneously formed, with floating gate structure 30A being a component of the HV DMOS transistor and floating gate structure 30B being a component of the EEPROM cell. Floating gate structures 30A and 30B may be formed in any suitable manner and from any suitable materials. For example, floating gate structures 30A and 30B may be formed by creating a stack of a tunnel oxide layer, a floating gate layer, and an oxide-nitride layer, and etching the stack to form the illustrated structures 30A and 30B, such that DMOS floating gate structure 30A comprises a tunnel oxide region 32A, a DMOS floating gate 34A, and an oxide-nitride region 36A, and EEPROM floating gate structure 30B similarly comprises a tunnel oxide region 32B, an EEPROM floating gate 34B, and an oxide-nitride region 36B. As shown, DMOS floating gate structure 30A may extend partially over the first isolation region 18A, while EEPROM floating gate structure 30B may be located spaced apart from the second isolation region 18B. Floating gates 34A and 34B, which may also be referred to as the "Poly 1" layer, may be formed from polysilicon or any other suitable material.

In embodiments that also involve producing p-type HV DMOS transistors EEPROM cells for an integrated array, the steps discussed above regarding FIG. 2 may also be repeated, with the n-type/p-type doping switched, for producing p-type HV DMOS transistors EEPROM cells of an integrated array, as discussed above.

Figure 3:
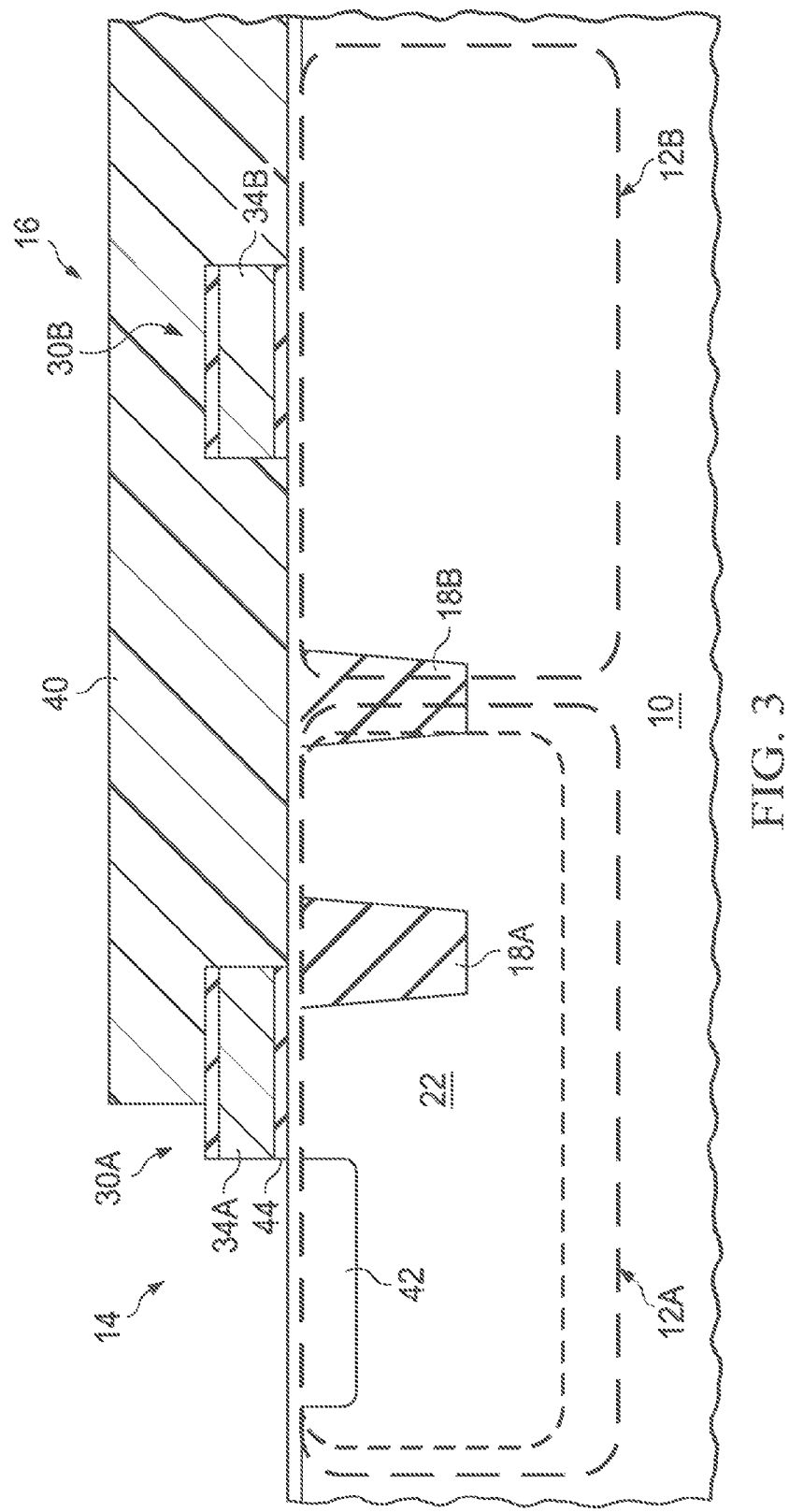

Next, as shown in FIG. 3, a photomask 40 may then be formed over the EEPROM cell region 16, including EEPROM floating gate structure 30B, and extending over a portion of the HV DMOS region 14, in particular extending partially over HV DMOS floating gate structure 30A. A p-doped base implant, or "p-channel," 42 is formed in the HV n-drift implant region 22, such that the p-doped base implant 42 is self-aligned with an edge 44 of the HV DMOS floating gate structure 30A. The photomask 40 may then be removed.

In embodiments that also involve producing p-type HV DMOS transistors EEPROM cells for an integrated array, the steps discussed above regarding FIG. 3 may be repeated, with the n-type/p-type doping switched, for producing p-type HV DMOS transistors EEPROM cells of an integrated array, as discussed above. Thus, another photomask (not shown) corresponding to photomask 40 may be used for forming an n-doped base implant region for each p-type DMOS transistor, with each n-doped base implant region being self-aligned to an edge of a respective floating gate structure. Depending on the thickness of the floating gate layer, because this provides the self-aligned mask to the base implant, a thermal drive step after the implant may be added to create greater depth of this base layer 42 into the semiconductor substrate.

Figure 4:
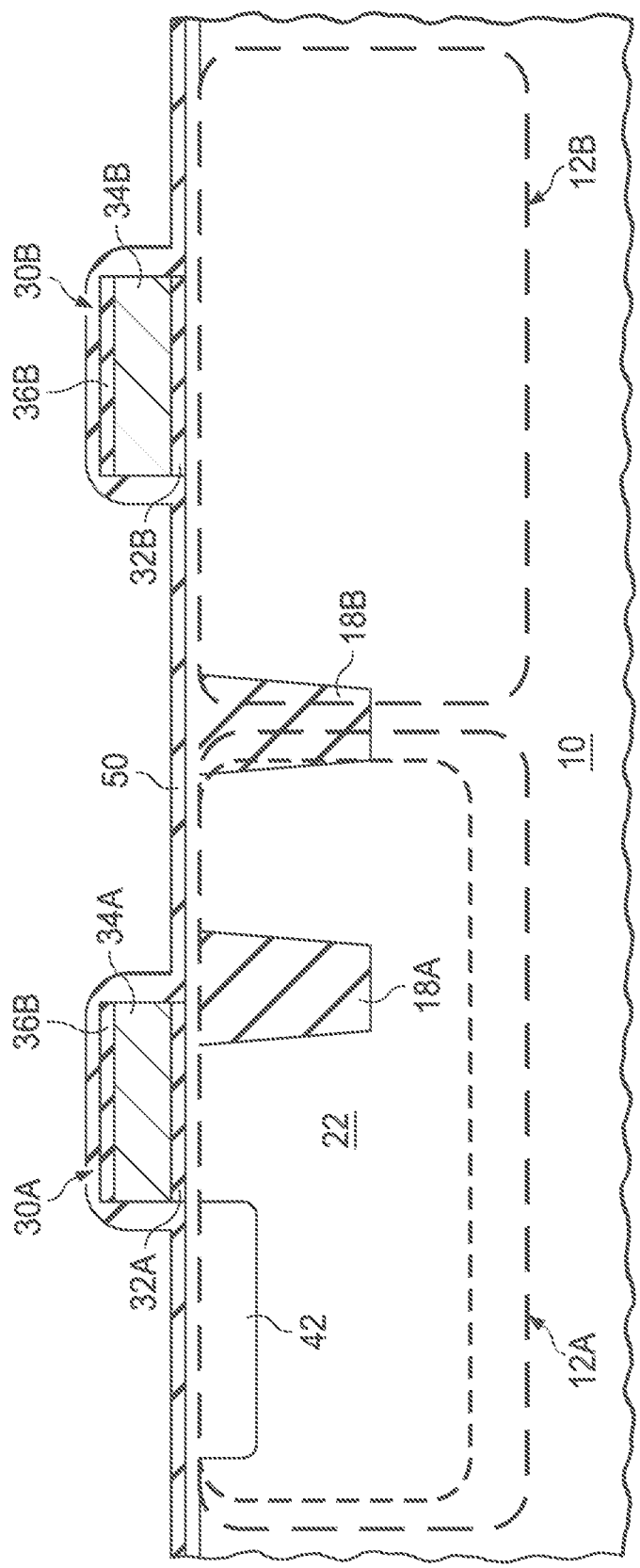

Next, as shown in FIG. 4, an oxide layer 50 may be formed over the full structure. For example, a HV 250Å oxide layer may be formed by a standard deposition and oxidation process. Oxide layer 50 may act with oxide-nitride regions 36A and 36B on top of floating gate structures 30A and 30B to define an oxide-nitride-oxide (ONO) layer above floating gates 34A and 34B.

In embodiments that also involve producing p-type HV DMOS transistors EEPROM cells for an integrated array, the oxide layer 50 may extend over the n-type HV DMOS transistors EEPROM cells and p-type HV DMOS transistors EEPROM cells.

Figure 5:
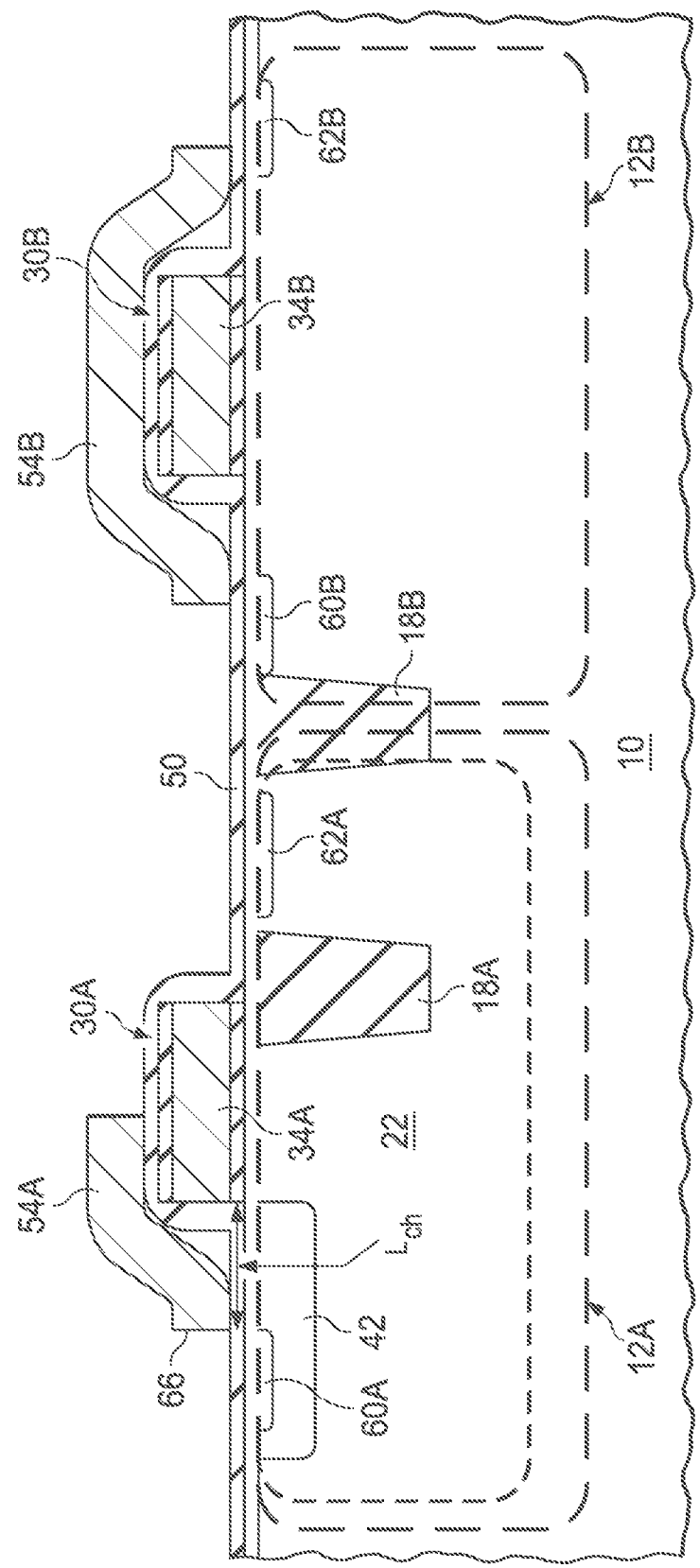

Next, as shown in FIG. 5, an HV DMOS control gate 54A and an EEPROM control gate 54B may be simultaneously formed over HV DMOS floating gate 34A and EEPROM floating gate 34B, respectively, using any suitable techniques (e.g., deposit, implant, pattern, and etch processes) and using any suitable materials. For example, control gates 54A and 54B may be formed from the same polysilicon layer, and referred to as "Poly 2" structures formed over the respective "Poly 1" floating gates 34A and 34B. In one embodiment, HV DMOS control gate 54A extends only partially over the top of floating gate structure 30A, while EEPROM control gate 54B fully covers extends fully across the top of floating gate structure 30B.

Then, source and drain regions may be implanted for both the HV DMOS and EEPROM in any suitable manner, e.g., by lightly-doped-drain (LDD) doping respective locations of the devices. For example, for the HV DMOS, an n-doped LDD source region 60A may be formed within the p-doped base implant 42, and an n-doped LDD drain region 62A may be formed on the opposite side of the isolation region 18A, as shown. The LDD source region 60A may be self-aligned with an edge 66 of the HV DMOS control gate 54A (i.e., DMOS Poly 2). For the EEPROM, n-doped LDD source and drain regions 60B and 62B may be formed on opposite sides of the EEPROM control gate 54B (i.e., EEPROM Poly 2).

The gate length, or channel length, of the control gate is indicated as $L_{ch}$. As known in the art, a narrow channel length is typically desired for a high performance DMOS transistor.

In embodiments that also involve producing p-type HV DMOS transistors EEPROM cells for an integrated array, the steps discussed above regarding FIG. 3 may be repeated, with the n-type/p-type doping switched, for producing p-type HV DMOS transistors EEPROM cells of an integrated array, as discussed above.

Figure 6:
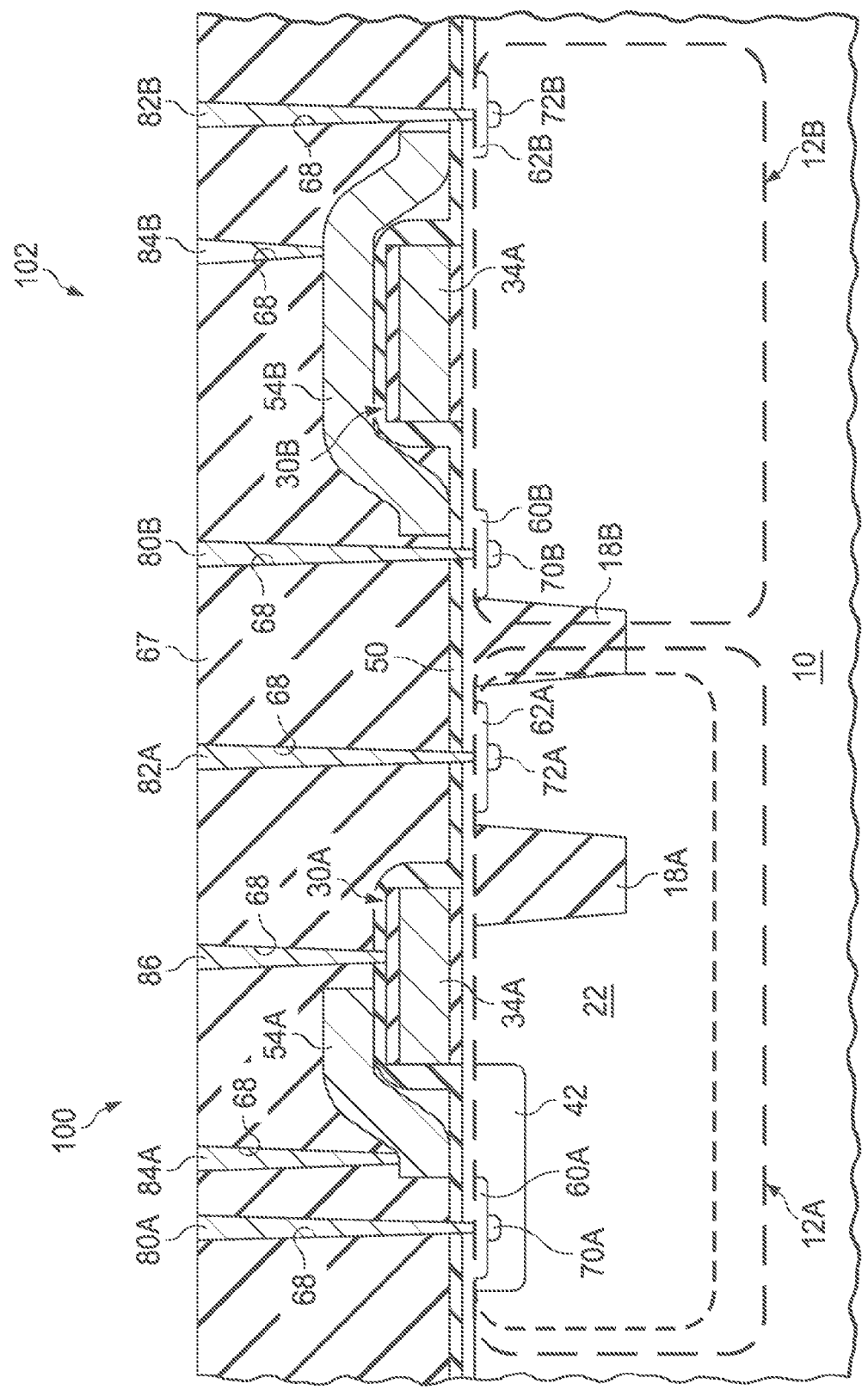

Next, as shown in FIG. 6, highly-doped n+ plug implants and conductive contacts (electrodes) may be formed. In particular, a deposited oxide layer 67 is formed over the structure, and a series of vertical openings 68 are formed as shown. As shown, vertical openings 68 are formed that extend down to each source and drain region, down to each control gate 54A and 54B, and also down to the top of the HV DMOS floating gate structure 30A. Highly-doped n+ plug implants are then implanted through the vertical openings 68 above each source and drain region 60A, 62A, 60B, and 62B, to form n+ plug implants 70A, 72A, 70B, and 72B. The highly-doped, n+ plug implants 70A, 72A, 70B, and 72B form a low-resistance contact for each source and drain.

Vertical openings 68 are then filled with metal (e.g., tungsten) or other conductive material to form a series of electrodes in contact with respective elements of the structure. In particular, source/drain electrodes 80A, 82A, 80B, and 82B contact each source and drain region 60A, 62A, 60B, and 62B; control gate electrodes 84A and 84B contact HV DMOS control gate 54A and EEPROM control gate 54B, respectively; and floating gate electrode 86 contacts HV DMOS floating gate 34A. The resulting completed structures are indicated as HV DMOS transistor 100 and EEPROM cell 102. The floating gate electrode 86 may be used to apply a voltage to the HV DMOS floating gate 34A for various purposes, e.g., to control a breakdown voltage ($V_{bd}$) and source-drain resistance ($R_{SD}$) of the HV DMOS device, and/or to provide a Faraday shield between the HV DMOS control gate 54A and drain region 62A, as discussed below in more detail.

Figure 7:
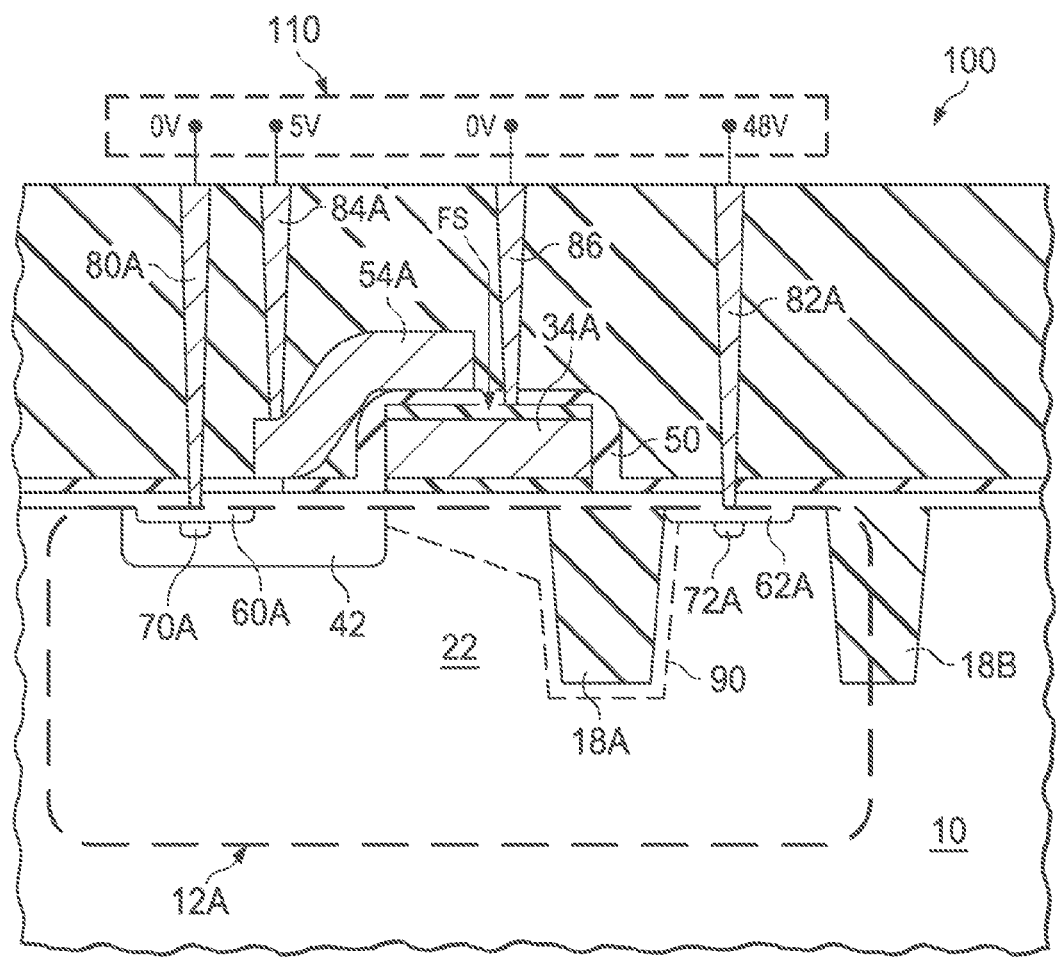
Figure 8:
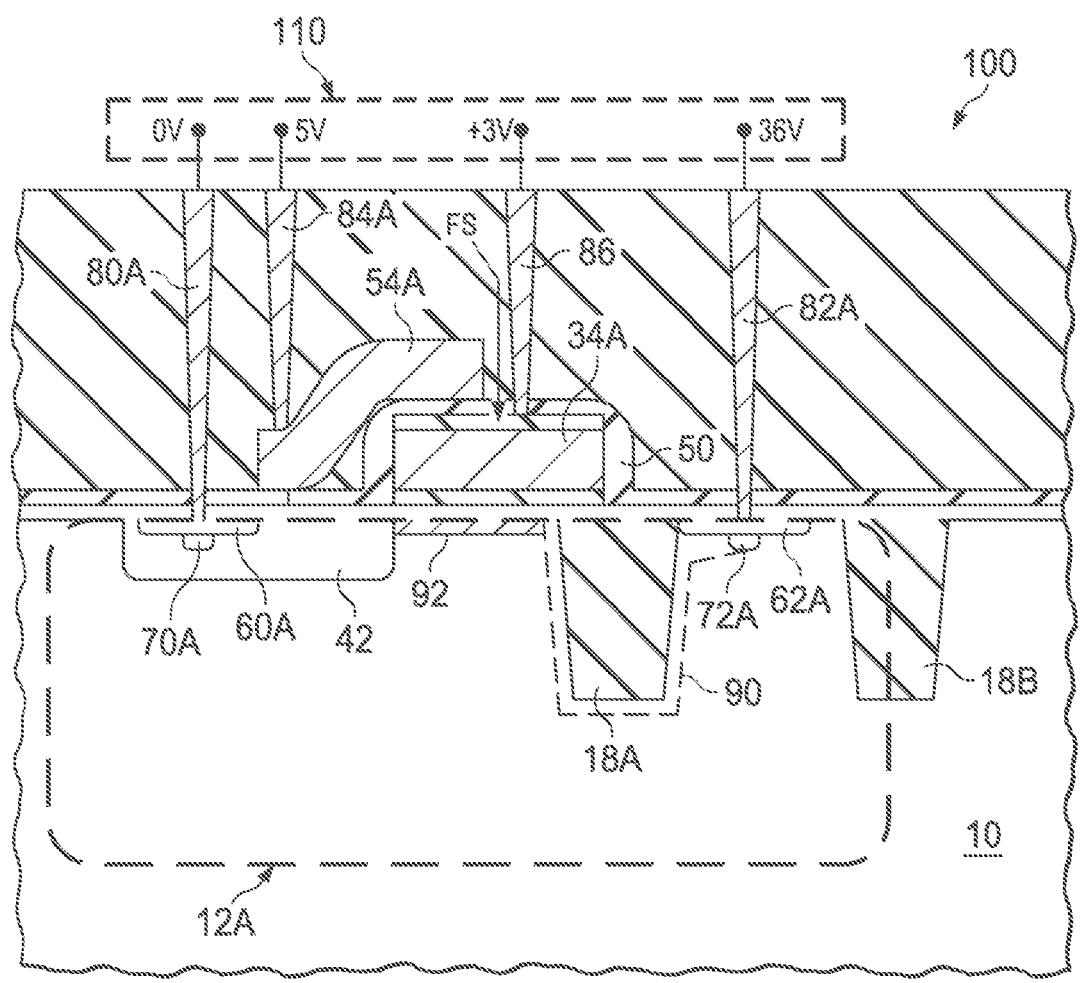

FIGS. 7 and 8, which focus on the HV DMOS transistor 100 and thus do not show the adjacent EEPROM cell 102. Control electronics 110 may be connected to source electrode 80A, drain electrode 82A, control gate electrode 84A, and floating gate electrode 86 to apply selected voltages to source 60A, drain 62A, control gate 54A, and floating gate 34A and control such voltages as desired. To control the HV DMOS 100, a voltage bias is applied to the control gate 54A via control gate electrode 84A, which creates an inversion region in the base implant (channel) region 42, which causes electrons to flow from the source electrode 70A to the drain electrode 72A.

FIGS. 7 and 8 illustrate two different voltage bias scenarios and the resulting effects. In particular, the two scenarios illustrate how characteristics of the n-drift region, such as the breakdown voltage ($V_{bd}$) and source-drain resistance ($R_{SD}$) or "on-state resistance," can be controlled by applying a selected voltage to the floating gate 34A.

In the scenario shown in FIG. 7, the floating gate 34A is grounded (0V applied via floating gate electrode 86), and a relatively large voltage drop occurs from drain 62A to source 60A across the depleted n-drift region. The field are of the voltage drop is indicated generally by the dashed line 90. This scenario (grounded floating gate) provides a relatively high breakdown voltage ($V_{bd}$) and relatively high source-drain resistance ($R_{SD}$).

In the scenario shown in FIG. 8, control electronics 110 apply a small positive voltage bias (+3V) to the floating gate 34A via the floating gate electrode 86. This causes an n-drift accumulation at the surface of the substrate below the floating gate 34A, indicated at 92. The accumulation region 92 lowers the source-drain resistance ($R_{SD}$), but also lowers the voltage drop across the n-drift region (36V in the scenario FIG. 8, as compared to 48V in the scenario of FIG. 7), and thus lowers the breakdown voltage ($V_{bd}$).

In a further scenario, control electronics 110 may apply a negative bias to the floating gate, which fully depletes the n-drift region, and thereby provides a higher $V_{bd}$ and $R_{SD}$ than the grounded scenario of FIG. 7.

The voltage applied to floating gate 34A via the floating gate electrode 86 can thus be selected, varied, or controlled to provide a desired breakdown voltage ($V_{bd}$) and source-drain resistance ($R_{SD}$). For example, the bias on the floating gate can be varied to create a desired tradeoff between $V_{bd}$ and $R_{SD}$. Further, biasing the floating gate to control the n-drift region characteristics allows the HV DMOS devices to be formed with one selected dimension and then controlled, e.g., tuned, to the desired performance characteristics, thus reducing the necessity for exact dimensioning of the device or the need to fabricate HV DMOS devices with different dimensions to achieve different performance characteristics.

Further, applying a fixed potential to the DMOS floating gate 34A provides a Faraday shield between the control gate (Poly 2) 54A and the drain region 62A. This may be particularly useful, for example, where the device is used in a high frequency application.

The process described above allows an existing process flow for forming EEPROM cells to be modified to form an integrated array with both EEPROM cells and HV DMOS transistors simultaneously, by adding two mask/implant steps for forming n-type or p-type DMOS transistors, or four mask/implant steps for forming both n-type and p-type DMOS transistors, i.e., the mask/implant steps discussed above with reference to FIGS. 1 and 3.

Although the disclosed embodiments are described in detail in the present disclosure, it should be understood that various changes, substitutions and alterations can be made to the embodiments without departing from their spirit and scope.

The invention claimed is:

1. A method of controlling a double diffused metal oxide semiconductor (DMOS) transistor including a base implant region formed in a substrate, a source region formed in the base implant region comprising a highly doped source implant, a drain region formed in the substrate comprising a highly doped drain implant, a floating gate, a stepped control gate extending over the base implant region and over the floating gate, a control gate electrode electrically coupled to the stepped control gate, a floating gate electrode electrically coupled to the floating gate, an oxide layer above said floating gate and said stepped control gate, a first vertical opening in the oxide layer filled with a conductive material to provide for a source electrode contacting said source region, a second vertical opening in the oxide layer filled with a conductive material to provide for a drain electrode contacting said drain region, and wherein the highly doped source implant and the highly doped drain implant are implanted through the first vertical opening and the second vertical opening, respectively, the method comprising:

applying a voltage to the floating gate via the floating gate electrode, thereby influencing a breakdown voltage and a source-drain resistance of the DMOS transistor.

2. The method of claim 1, comprising adjusting the voltage applied to the floating gate via the floating gate electrode.

3. A method of controlling a double diffused metal oxide semiconductor (DMOS) transistor with a substrate, a base implant region formed in the substrate, a source region formed in the base implant region, a drain region formed in the substrate, a floating gate formed above the substrate, a control gate extending over the base implant region, a floating gate electrode electrically coupled to the floating gate, an oxide layer above said floating gate and said control gate, a highly doped source implant implanted through a first vertical opening in the oxide layer, wherein the first vertical opening is filled with a conductive material to provide for a source electrode contacting said source region, and a highly doped drain implant implanted through a second vertical opening in the oxide layer, wherein the second vertical opening is filled with a conductive material to provide for a drain electrode contacting said drain region, the method comprising:

controlling a voltage applied to the floating gate via the floating gate electrode, thereby controlling a breakdown voltage and a source-drain resistance of the DMOS transistor.

4. The method according to claim 3, wherein the base implant region is self-aligned with an edge of the floating gate.

5. The method according to claim 3, wherein the source region is self-aligned with an edge of the control gate.

6. The method according to claim 3, wherein the DMOS transistor comprises a trench isolation region in the substrate between the base implant region and the drain region.

7. The method according to claim 3, wherein the DMOS transistor comprises a control gate electrode electrically coupled to the control gate; and the method comprises:

controlling a voltage applied to the control gate via the control gate electrode independent of the voltage applied to the floating gate.

8. The method according to claim 3, wherein:

an upper portion of the control gate extends over the floating gate;

the floating gate is located between the upper portion of the control gate and the drain region; and the method further comprises:

applying a voltage to the floating gate via the floating gate electrode to generate a Faraday shield between the upper portion of the control gate and the drain region.

9. The method according to claim 3, wherein the control gate covers only a portion of the floating gate, and the floating gate electrode is electrically coupled to the floating gate at a location not covered by the control gate.

10. A method for operating a double diffused metal oxide semiconductor (DMOS) transistor with a substrate, a base implant region formed in the substrate, a source region formed in the base implant region, a drain region formed in the substrate, a floating gate formed above the substrate, a control gate extending over the base implant region, and a floating gate electrode electrically coupled to the floating gate, wherein an edge of the base implant region is self-aligned with an edge of the floating gate and wherein an edge of the source region is self-aligned with an edge of the control gate; the method comprising:

controlling a voltage applied to the floating gate via the floating gate electrode, thereby controlling a breakdown voltage and a source-drain resistance of the DMOS transistor.

11. The method according to claim 10, wherein a trench isolation region is in the substrate between the base implant region and the drain region.

12. The method according to claim 10, wherein the DMOS transistor further comprises a control gate electrode electrically coupled to the control gate; and the method comprises:

controlling a voltage applied to the control gate via the control gate electrode independent of the voltage applied to the floating gate.

13. The method according to claim 10, wherein:

an upper portion of the control gate extends over the floating gate;

the floating gate is located between the upper portion of the control gate and the drain region; and the method comprises:

applying a voltage to the floating gate via the floating gate electrode to generate a Faraday shield between the upper portion of the control gate and the drain region.

14. The method according to claim 10, wherein the control gate covers only a portion of the floating gate, and the floating gate electrode is electrically coupled to the floating gate at a location not covered by the control gate.

15. The method according to claim 10, wherein the DMOS transistor comprises:

an oxide layer above said floating gate and said control gate;

a highly doped source implant implanted through a first vertical opening in the oxide layer, wherein the first vertical opening is filled with a conductive material to provide for a source electrode contacting said source region;

a highly doped drain implant implanted through a second vertical opening in the oxide layer, wherein the second vertical opening is filled with a conductive material to provide for a drain electrode contacting said drain region; and third and fourth vertical openings in the oxide layer, wherein the third and fourth vertical openings are filled with a conductive material to provide for a control gate electrode and the floating gate electrode, respectively.

16. A method for operating a double diffused metal oxide semiconductor (DMOS) transistor with a substrate, a base implant region formed in the substrate, a source region formed in the base implant region, a drain region formed in the substrate, a floating gate formed above the substrate, a control gate extending over the base implant region, a floating gate electrode electrically coupled to the floating gate, and a trench isolation region in the substrate between the base implant region and the drain region, the trench isolation region extending horizontally under the floating gate but not under the control gate, the method comprising:

controlling a voltage applied to the floating gate via the floating gate electrode, thereby controlling a breakdown voltage and a source-drain resistance of the DMOS transistor.

17. The method according to claim 16, wherein the DMOS transistor further comprises an oxide layer above said floating gate and said control gate, a highly doped source implant implanted through a first vertical opening in the oxide layer, wherein the first vertical opening is filled with a conductive material to provide for a source electrode contacting said source region; and a highly doped drain implant implanted through a second vertical opening in the oxide layer, wherein the second vertical opening is filled with a conductive material to provide for a drain electrode contacting said drain region.

18. The method according to claim 17, further comprising third and fourth vertical openings in the oxide layer, wherein the third and fourth vertical openings are filled with a conductive material to provide for a control gate electrode and the floating gate electrode, respectively.

19. The method according to claim 16, wherein the base implant region is self-aligned with an edge of the floating gate and/or wherein the source region is self-aligned with an edge of the control gate.

20. The method according to claim 16, wherein the DMOS transistor further comprises a control gate electrode electrically coupled to the control gate; and the method comprises:
controlling a voltage applied to the control gate via the control gate electrode independent of the voltage applied to the floating gate.

21. The method according to claim 16, wherein:
an upper portion of the control gate extends over the floating gate;
the floating gate is located between the upper portion of the control gate and the drain region; and the method comprises
applying a voltage to the floating gate via the floating gate electrode to generate a Faraday shield between the upper portion of the control gate and the drain region.

22. The method according to claim 16, wherein the control gate covers only a portion of the floating gate, and the floating gate electrode is electrically coupled to the floating gate at a location not covered by the control gate.

\* \* \* \* \*